Dec. 14, 1965 J. A. RODAER 3,223,935

PLURAL CHANNEL AMPLIFIER WITH AUTOMATIC CUT OFF MEANS

Filed Sept. 25, 1961 2 Sheets-Sheet 1

INVENTOR.
James A. Rodaer
BY
Robert E. Fowler
ATTORNEY

INVENTOR.
James A. Rodaer
BY
Robert C. Fowler
ATTORNEY

United States Patent Office 3,223,935
Patented Dec. 14, 1965

3,223,935
PLURAL CHANNEL AMPLIFIER WITH AUTOMATIC CUT OFF MEANS

James A. Rodaer, Kokomo, Ind., assignor to General Motors Corporation, Detroit, Mich., a corporation of Delaware Filed Sept. 25, 1961, Ser. No. 140,593
5 Claims. (Cl. 330—19)

This invention relates to power amplifier means and more particularly to transistorized power amplifier means capable of amplifying square wave signals which include zero voltage periods between half cycles.

In multi-phase static inverter systems it is necessary to regulate the wave amplitude of each phase independently without introducing any phase shift in order to prevent circulating currents in the final three-phase connection. Thus the feedback error voltage from the output is utilized to modify or modulate the width of the pulses in such systems about a fixed 180° index in order that there be no phase change. By this means the power or amplitude per pulse is changed for regulatory purposes but the phase is not changed. A static inverter system utilizing pulse width modulation regulation is shown and described in co-pending application Serial No. 109,321, filed May 11, 1961, in the name of Wesley G. Runyan, entitled "Static Inverter" and assigned to a common assignee.

Such pulse wave trains pose problems in amplification since they include a series of plus and minus square wave pulses separated by finite off times.

It is an object in making this invention to provide a power amplifier for alternating current waves which include periods of zero voltage.

It is a further object in making this invention to provide a power amplifier for handling square wave pulses separated by zero voltage times.

It is a further object in making this invention to provide power amplifier means that is held in non-conducting condition with no input.

Figure 1:
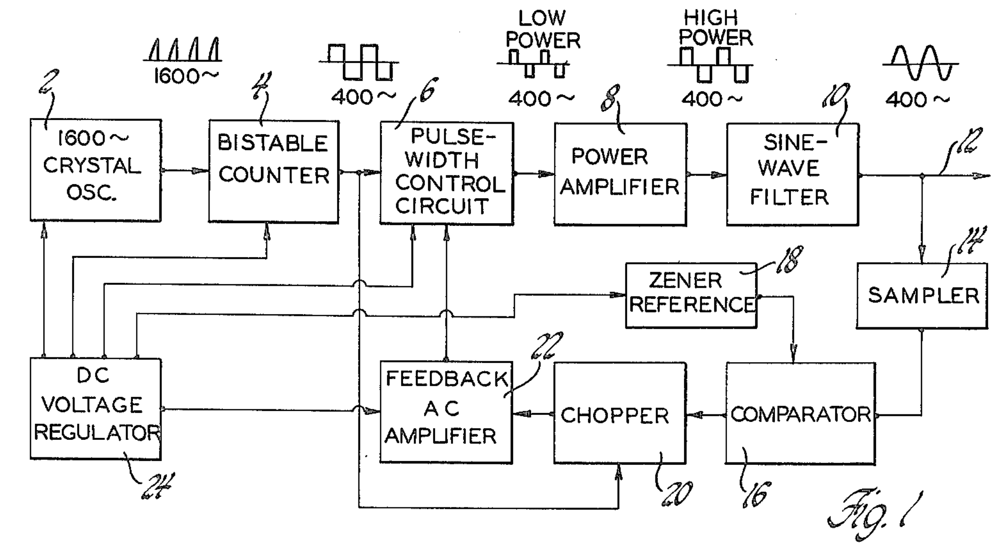
Figure 2:
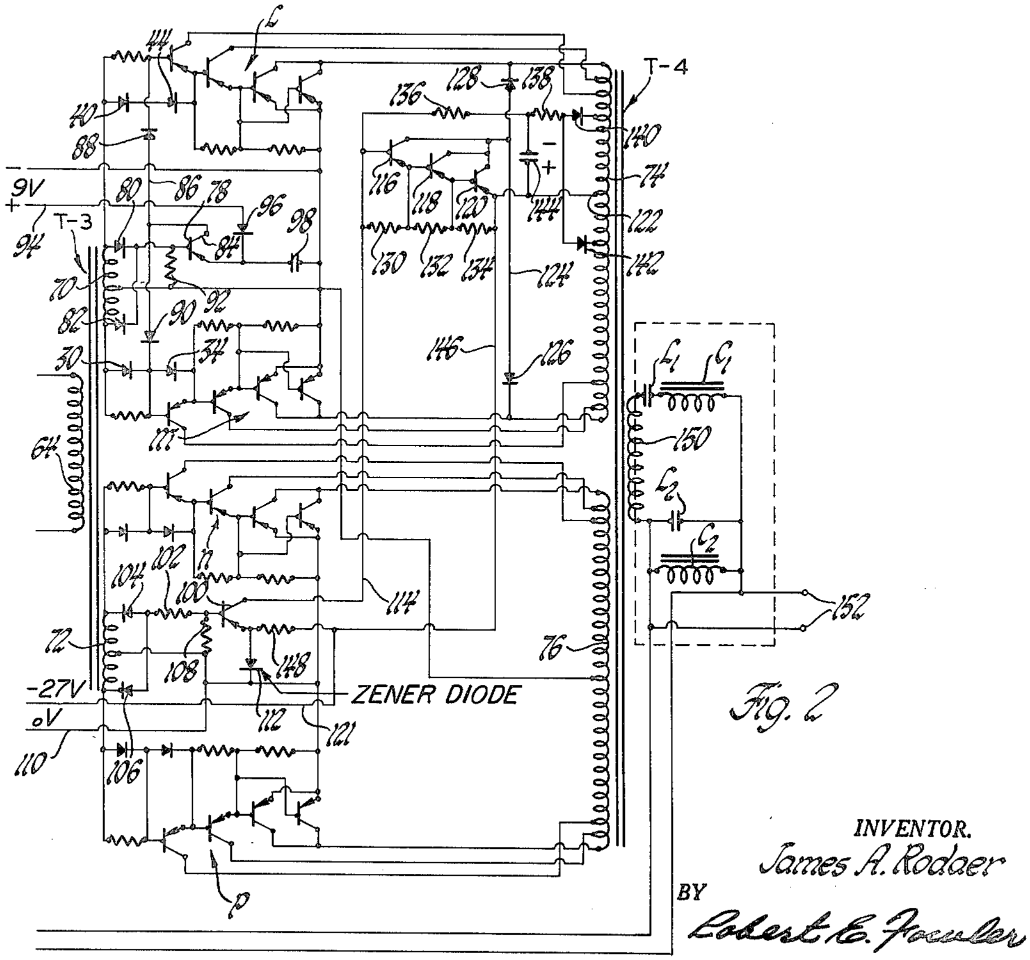

With these and other objects in view which will become apparent as the specification proceeds, my invention will be best understood by reference to the following specification and claims and the illustrations in the accompanying drawings, in which:

FIGURE 1 is a block diagram of a static inverter system in which the power amplifier means of my invention may be used; and FIGURE 2 is a circuit diagram of a completely transistorized power amplifier means embodying the invention.

Figure 3A:
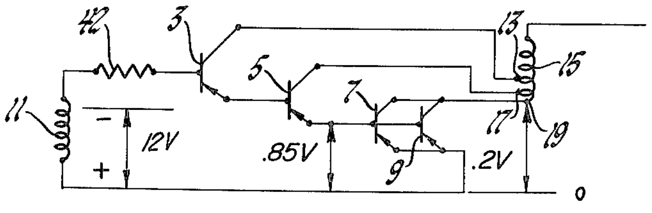
Figure 3B:
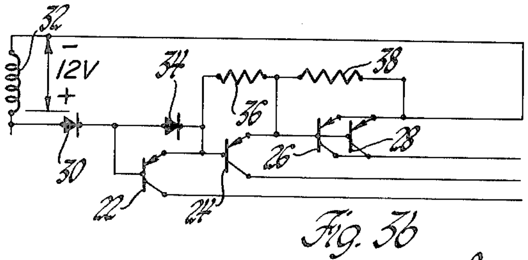
Figure 4:
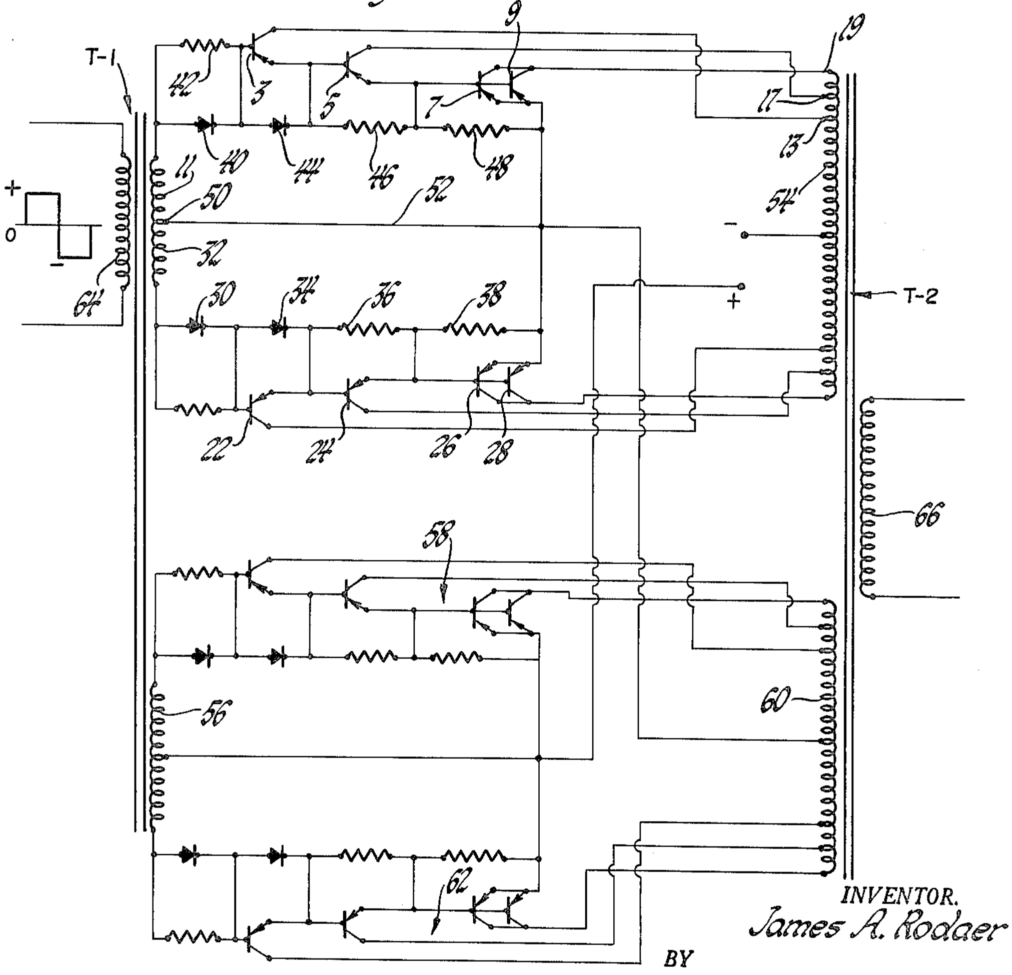

FIGURE 3*a* is a partial circuit of one bank of direct coupled transistor amplifiers without biasing means;

FIGURE 3*b* is a similar figure of a second bank with the biasing means added;

FIGURE 4 is a circuit diagram showing the basic tandem pair of banks from the two transformer secondaries but with the holding and regulating means omitted for simplicity.

A static inverter system for converting low voltage D.C. power to higher voltage A.C. power is shown in FIG. 1. Such a system is the subject matter of a co-pending application for Letters Patent Serial No 150,975 filed November 8, 1961, in the name of Wesley G. Runyan and entitled, "Static Inverter System."

Referring now generally to FIG. 1 a basic system in which the power amplifier of this invention may be utilized is shown. This system includes a power oscillator 2 which might, for example, generate waves at a frequency of 1600 cycles which feeds its output into a bi-stable counter unit 4 wherein the frequency is reduced to the desired output frequency. Much aircraft facilities use 400 cycle A.C. current and so for illustrative purposes it is assumed in this system that the basic oscillatory frequency is divided down to 400 cycles by bi-stable means. The 400 cycle square wave output from the counter 4 is fed into a pulse width control circuit 6 such as that described in either of the above identified cases and in this section the square waves are modulated in width depending upon the feedback control voltage for regulatory purposes. However, the 180° distances always remain constant. The output of the pulse width control circuit is a series of alternate plus and minus square wave pulses separated by off times as shown illustratively above the connection between the pulse width control circuit 6 and the power amplifier 8. The power amplifier 8 is the subject matter of the present disclosure and will be discussed in detail at a later point. The output of the power amplifier is still a square wave output and that is fed into a sine wave filter section 10 consisting of a series and a parallel LC circuit to convert the square wave pulses into a full sine wave output on the output line 12.

For regulatory purposes a sample of the output voltage is applied to a sampler section 14 and then into a comparator 16 to which a standard voltage from a Zener reference 18 is applied. The difference voltage between the standard and that fed back through the sampler is a varying D.C. voltage and this is applied to a chopper 20 to be chopped up and converted to A.C. for better amplification, the frequency of the chopper being controlled by the 400 cycle output of the bi-stable counter 4. The corrective A.C. feedback voltage is then applied to an amplifier section 22 by for amplification and then back to the pulse width control circuit 6 for regulation. A source of D.C. voltage is, of course, necessary which voltage is regulated in section 24 and applied to the various sections of the system as it is needed. Through the use of this basic system a 25 to 30 volt D.C. supply is converted to a 115 volt A.C. output.

As before stated the output of the pulse width control circuit consists in a series of alternate plus and minus square wave pulses separated by off times and it is the function of the power amplifier 8 to amplify these pulses. It is obvious that in a system of this kind a relatively high current will be utilized and it is desirable to have a high current gain. One of the best circuit connections for high current gain is a direct coupled compound connection such as that shown in FIG. 3*a*. The use of a direct compound connection such as that shown basically in FIG. 3*a* has the advantage of very high current gain with a minimum of circuitry but it has the disadvantage of an inherent high voltage drop in saturated state. In order to carry a sufficient amount of current, transistors having the proper biasing were direct coupled as shown in FIG. 3*a*. In that figure transistors 3, 5, 7 and 9 are shown connected between a secondary input winding 11 and a primary output winding 115 and about a midpoint in both windings illustrated by the horizontal line labeled zero. The taps 13, 17 and 19 on the primary winding 15 provide suitable bias voltages for the transistors to which they are connected. With certain specific transistors used and with a 12 volt input across secondary coil 10 as indicated the transistors connected in this order will provide the necessary current carrying capacity for the desired amplification.

Referring momentarily to FIG. 4, it is seen that there are two sections or channels and that each section includes a pair of conductive paths extending between the upper and lower terminals of two secondary and two primary windings which alternately conduct depending upon the polarity of the incoming wave. One path in each channel is conductive simultaneously. Thus, referring to the upper section or path in FIG. 4, transistors 3, 5, 7 and 9 as shown in FIG. 3*a* could be connected into the circuit as shown and biased by taps 13, 17 and 19, respectively. In this type of operation when the top bank of transistors such as 3, 5, 7 and 9 conduct the lower bank as illustrated by transistors 22, 24, 26 and 28 are non-conductive and vice versa. One bank conducts during the time plus pulses are applied to the input transformer and the other bank when minus pulses are applied.

It is necessary to provide means for cutting off or reverse biasing that set or bank which are non-conducting and this is provided through the use of reverse biasing means. FIG. 3*b* is included to illustrate this point. In order to provide the proper reverse biasing means a diode 30 is connected between the lower terminal of an input transformer secondary 32 and the base terminal of transistor 22. A second diode 34 is connected across the base to emitter electrodes of transistor 22. A biasing resistance 36 is connected across base to emitter electrodes of transistor 24 and finally a resistance 38 is connected across the base to emitter electrodes of transistors 26 and 28. When one bank of transistors is conducting the current flow through the diode-resistance combination associated with the other bank is sufficient to reverse bias all of the transistors in that bank and keep them cut off. Since the parts shown in FIG. 3*b* are merely taken from the more sophisticated drawing of FIG. 4 the same reference characters are used in FIG. 4 to designate the same.

A similar reverse biasing group of diodes and resistance is used for the first bank. Diode 40 is connected across biasing resistor 42 connected from the upper terminal of the secondary 11 to the base of transistor 3; diode 44 is connected across the base to emitter electrodes of transistor 3; resistor 46 is connected across the base to emitter electrodes of transistor 5 and the resistance 48 is connected across the base to emitter electrodes of transistors 7 and 9. The center tap 50 of the secondary winding of transformer T–1 is connected through line 52 directly to the emitter electrodes of transistors 7 and 9 and 26 and 28 and to the ends of the biasing lines. The voltage developed in the top half 11 of the secondary winding is, therefore, applied to the inputs of the transistors 3, 5, 7 and 9 and for one half cycle or during the time which a plus pulse is applied, these transistors conduct and current flows to the primary winding 54 of the output transformer T–2. During this time also a reverse biasing current flows through the circuit including diodes 30 and 34 and resistances 36 and 38 to keep the other bank of transistors 22, 24, 26 and 28 cut off.

A second tandem coupling of exactly the same construction and including transformer secondary 56, the upper terminal of which is connected through a first bank of transistors 58 to a series of taps on the upper end of primary winding 60 on transformer T–2 has its lower terminal similarly connected through a second bank of transistors 62 connected to taps on the lower end of the same primary winding 60. When a plus pulse is applied to the primary winding 64 of the transformer T–1 and causes the upper bank of the first channel connection including transistors 3, 5, 7 and 9 to conduct and permit the flow of current in the primary 54, simultaneously the upper bank 58 of the second channel conducts and causes a current flow through the upper half of winding 60 to provide two parallel paths to the two primary windings 54 and 60 and an output current in the secondary winding 66.

As before mentioned the use of this type of pulse amplifier circuit for waves including spaced plus and minus pulses and a finite off time introduces the problem of having a certain time during which there is no voltage present. This requires a means of cutting off the switching transistors during this so-called "zero time." If no bias is applied to the transistors in the various paths during this off time a high leakage current will result and consequently high collector dissipation. In order to provide a positive cut off bias during "zero time" additional circuitry is added.

Referring now to FIG. 2 which is a circuit diagram of a complete system embodying the invention, there is shown therein an input transformer T–3 having a primary input coil 64 and two secondary coils 70 and 72. Secondary coil 70 has its upper terminal connected through a first bank of transistors L to the upper end of primary winding 74 of transformer T–4. The lower connection of transformer secondary 70 is through a second bank of transistors M to the lower end of primary winding 74 through connections specifically described with relation to FIGS. 3 and 4. In like manner the upper terminal of secondary 72 is connected through a bank of transistors N to the upper end of primary winding 76 of transformer T–4 and the lower end of secondary 72 through bank P to the lower terminal of primary 76. These connections are all the same except for the specific components used in FIG. 4 and, therefore, the specific connections will not be again referred to in detail here. To this point when a pulse appears on the primary 64, both banks L and N will be conductive and current will flow through the primary windings 74 and 76 due to these connections. At the same time the lower banks M and P will be held nonconductive by reverse bias or current flow through the diodes and resistances connected across the input circuits of each. When the polarity of the pulses applied to the primary reverse, the conductivity of these channels is reversed so that banks L and N now become non-conductive and M and P conductive to provide the current flow through the primaries and the necessary output currents.

As mentioned above the square wave plus and minus pulses are separated by certain periods during which no voltage appears or "zero times" and it is necessary to apply some means to specifically bias all transistors to cut off during these periods. The means for accomplishing this is an additional transistor 78 whose base electrode is connected directly to the upper terminal of the secondary 70 through diode 80 and also to the lower terminal of the same secondary through diode 82. The collector electrode 84 of the transistor 78 is connected to conductor 86 which in turn is connected to two diodes 88 and 90. Diode 88 has its remaining terminal connected to a point intermediate the two diodes 40 and 44 for providing reverse biasing for the upper bank L and also directly to the base of the first transistor in the bank L. The remaining terminal of diode 90 is in like manner connected to a point intermediate the reverse biasing diodes 30 and 34 of the lower bank M and also to the base of the first transistor in that bank. A biasing resistor 92 is connected directly between the base of the transistor 78 and the center tap of the secondary winding 70 to provide base bias for this transistor. A source of permanent emitter bias is applied through line 94 to the emitter electrode of the transistor 78 via diode 96. Emitter electrode of transistor 78 is also connected through a condenser 98 to the emitter electrodes at the right ends of banks L and M.

In operation of this portion of the system a permanent +9 volt bias is applied to the emitter of the transistor 78 over line 94 by any desired means. During the application of either plus or minus square wave voltages to primary 64 a −12 volts will be developed across the resistance 92 applied to the base of transistor 78 to hold this transistor non-conductive or off during these times. However, during "zero time" or when there is no voltage on the transformer winding 64 the bias across resistance 92 will disappear and the +9 volt emitter bias will cause transistor 78 to conduct. With this transistor conducting, or with this switch on, the input bases of all of the transistors in banks L and M have a positive voltage applied thereto and, therefore, hold both of these banks cut off. This minimizes any flow through these direct coupled banks L and M during off times. Since the upper two banks are held off it is not found necessary to hold the lower banks in the same manner as there is insufficient leakage to warrant this.

There are other problems that are introduced by the fact that the two banks or switches are open or off during "zero time." One is caused by the fact that, at the beginning of each "zero time" interval, the output transformer T–4 has a net leakage field. Since all switches are open, the collapse of the magnetic fields must cause a current flow through the held off transistor which is undesirable. Second, looking into the amplifier from the output filter the amplifier output impedance becomes extremely high during the "zero time" and this causes distortion of the output wave form due to the inability of the tuned circuit in the filter to resonate properly. In order to correct for these difficulties means have been provided to short circuit a portion of the primary winding of T–4. This shorting control is triggered by the signal appearing on secondary 72 of transformer T–3 and is controlled by transistor 100. This transistor has its base connected through a series resistance 102 and a diode 104 to the upper terminal of the secondary winding 72 and also through the same resistance in series with a second diode 106 to the lower terminal of the winding 72. The center tap of winding 72 is connected through a second resistor 108 to the base of transistor 100.

A power supply line 110 is connected to the center tap of the secondary winding 72 and also to a Zener diode 112 whose other terminal is connected to the emitter electrode of the transistor 100 to apply a fixed bias thereto. Power supply line 110 also extends to the emitter electrodes of the banks N and P. The collector electrode of transistor 100 is connected through conductor 114 to the base electrode of the first of a series of transistors 116, 118, 120 connected in series to switch the desired short circuit. The emitter electrode of the last transistor 120 is connected directly to a tap 122 on the primary winding 74. The collector electrodes of all three of these transistors are connected commonly together and to line 124. Line 124 is connected through a first diode 126 to the lower end of the primary winding 74 and through diode 128 to the upper end of the winding 74. Biasing resistors 130, 132 and 134 are connected across the base to emitter circuits of the three transistors 116, 118 and 120, respectively. A first resistance 136 is connected between the base of the transistor 116 and one terminal of a second series resistance 138. The remaining terminal of the resistance 138 is commonly connected to two diodes 140 and 142 each of which are connected to different spaced taps on the primary winding 74 of the transformer T–4. A condenser 144 is connected from a point between the resistances 136 and 138 to the emitter electrode of transistor 120 and tap 122 on primary 74. Line 146 extends between the emitter electrode for transistor 120 a power line 121 and the emitter electrode for transistor 100 including in series therewith a biasing resistance 148.

The operation of this portion of the system is as follows: the condenser 144 is charged through diodes 140 and 142 to approximately 6 volts during either plus or minus pulse time. During this same time the base circuit of transistor 100 has a —12 volts applied thereto by the pulses on primary 64 which causes it to be conductive. With this transistor conducting or with this switch on the base of transistor 116 is at a —6.8 volts due to the fixed bias provided by the Zener diode 112 in the emitter circuit of transistor 100. This biases the banks 116, 118 and 120 off since line 146 is still more negative at —27 volts and the emitters of each transistor are more negative than the bases and, therefore, during the reception time of either plus or minus pulses there is no shorting of the primary winding 74. However, with the arrival of zero time or off time the base circuit of transistor 100 goes to approximately zero potential and this transistor, therefore, turns off or becomes non-conductive. This removes the —6.8 volt bias on the base of the first transistor 116. While the emitter bias line for transistors 116, 118 and 120 still has —27 volts applied thereto the rise in the base voltage to zero is sufficient to cause the transistors to be so balanced as to become conductive under the conditions now present. The condenser 144 now discharges through the emitter-base diode circuits of all of these transistors 120, 118 and 116 in the forward direction to cause this compound transistor switch circuit to turn on. With these transistors on or this switch conducting the transformer primary 74 is shorted from center tap 122 to either the upper or lower outside terminal.

The amplified square wave applied to the secondary winding 150 of the transformer T–4 is filtered through the series LC circuit L1C1 and the parallel LC circuit L2C2 and applied to the output terminals 152 for use as a sine wave.

There is thus provided herein a satisfactory direct compound coupled transistorized square wave amplifier.

What is claimed is:

1. In amplifying means for alternating current waves in which there are finite periods of zero voltage, an input circuit to which the waves to be amplified are applied including a transformer having a primary and a secondary winding, an output circuit from which amplified waves may be applied to a load including a transformer having a primary winding, a plurality of transistor amplifier circuits to amplify said input waves, each of said transistor amplifier circuits having an amplifier input and output, each of the outer terminals of said input secondary winding being connected to separate amplifier inputs and each of the outer terminals of said output primary being connected to separate transistor amplifier outputs to provide at least two interconnecting circuits between said input and output transformers, diode-resistance biasing control means being connected to each transistor amplifier circuit and to the alternating current wave input circuit to provide transistor electrode biasing in said amplifier circuits so that when an input wave is of one polarity the transistor amplifier circuit of one interconnecting circuit is conducting and the transistor amplifier circuit of another interconnecting circuit is non-conducting and when said input wave is of an opposite polarity said diode-resistance control means provides respectively opposite amplifier conduction to apply an amplified alternating current to the output circuit, a source of electrical power, a biasing transistor amplifier circuit means having an output connected between said power source and said diode-resistance biasing circuit means, means connecting the input of said biasing transistor amplifier circuit means to said alternating current wave input circuit to cause power from said source to apply a cut-off bias to said transistor amplifier circuits during periods of zero voltage of the input alternating current wave, thereby maintaining the transistor amplifier circuits non-conducting to minimize leakage through said transistor amplifier circuits.

2. In amplifying means for alternating current waves in which there are finite periods of zero voltage, an input circuit to which the waves to be amplified are applied including a transformer having a primary and a secondary winding, an output circuit from which amplified waves may be applied to a load, including a transformer having a primary winding having inductance and creating magnetic fields when current flows therethrough, a plurality of pairs of direct coupled compound connected transistor amplifier circuits to amplify said input waves, each of said compound connected transistor amplifier circuits having an input and an output, each of the outer terminals of said input secondary winding being connected to separate transistor amplifier inputs and each of the outer terminals of said output primary being connected to a separate transistor amplifier output to provide at least two interconnecting circuits between said input and output transformers, diode-resistance biasing control means being connected to each compound connected transistor amplifier circuit and to the alternating current wave input circuit to provide transistor electrode biasing in said component connected transistor amplifier circuits so that when an input wave is of one polarity one compound connected amplifier circuit conducts and the other of the pair is cut off, and when an alternate polarity input wave is applied respectively alternate amplifier conduction occurs to apply alternating current to the output circuit, a source of electrical power, a biasing transistor amplifier circuit having an output connected between said power source and said diode-resistance biasing circuit means, means connecting the input of said biasing transistor amplifier circuit to said alternating current wave input circuit to cause power from said source to apply a cut-off bias to each compound connected transistor amplifier during periods of zero voltage of the input alternating current wave, thereby maintaining the compound connected transistor amplifier circuits non-conducting to minimize leakage through said amplifier circuits, short circuiting means being connected across a portion of the output transformer primary winding and including a transistor switching circuit means for connecting and disconnecting said short circuit means across said output primary winding, said transistor switching means having a biasing network connected thereto, a second source of electrical power, an electronic control means being connected between said second source of electrical power and the biasing network of said transistor switching means, means connecting the input of said electronic control means to said alternating current wave input circuit, means including a biasing network connected to the electronic control means and the alternating current wave input circuit to change the conductance of the electronic control circuit when the alternating current is zero thereby changing the bias of said transistor switching biasing means so as to cause the switching means to conduct during periods of zero input voltage and to short circuit the portion of the primary winding, thereby absorbing the collapsing field energy.

3. In amplifying means for alternating current waves in which there are finite periods of zero voltage, input circuit means to which the waves to be amplified are applied, output transformer means having a primary winding, a first direct coupled compound connected transistor amplifier circuit having an input connected to said alternating current wave input circuit means and an output connected to one terminal of the primary winding of the output transformer forming a first conductive path, a second direct coupled compound connected transistor amplifier circuit having an input connected to said alternating current wave input circuit and an output connected to an opposite terminal of the primary winding forming a second conductive path, diode-resistance biasing means connected to each direct coupled compound connected transistor amplifier circuit and to the alternating current wave input circuit to properly bias the transistor electrodes of said direct coupled transistor amplifier circuits for either conduction or non-conduction so that when an incoming signal of one polarity is applied to said alternating current wave input circuit, one compound connected transistor amplifier circuit is biased to conduct and the other amplifier circuit is held non-conducting, and when a signal of the opposite polarity is applied, the first compound connected transistor amplifier circuit will be biased off and the second compound connected transistor amplifier circuit will be biased to conduct so that alternating current will be developed in the output transformer, a source of electrical power, a biasing transistor amplifier circuit means having an output connected between said power source and said diode-resistance biasing circuit means, means connecting the input of said biasing transistor amplifier circuit means to said alternating current wave input circuit to cause power from said source to apply a cut-off bias to both compound connected transistor amplifier circuits when there is zero voltage applied to said input.

4. In amplifying means for alternating current waves in which there are finite periods of zero voltage, an input circuit means to which the waves to be amplified are applied, output transformer means having a primary winding, a first direct coupled compound connected transistor amplifier circuit having an input connected to the alternating current wave input means and an output connected to one terminal of the primary winding of the output transformer to form a first conductive path, a second direct coupled compound connected transistor amplifier circuit having an input connected to the alternating current wave input circuit and an output connected to another terminal of the primary winding to form a second conductive path, a diode-resistance biasing circuit means connected in circuit with said input circuit and each direct coupled compound connected transistor amplifier circuit to properly bias the transistor electrodes of said compound connected transistor circuits alternately conducting or non-conducting when said incoming wave is alternately of one polarity or the other, a source of electrical power, first transistor switching means connected to said source of electrical power and to each of said diode-resistance biasing circuit means to apply a voltage to each of said compound connected transistor amplifier circuits to bias said compound connected amplifier circuits off when the input wave is at zero voltage, a shunting circuit connected across the output transformer primary winding, a second source of electrical power, a second transistor switching means connected in circuit with said shunting circuit to connect and disconnect said shunting circuit across said output primary winding, said second transistor switching means including a biasing means connected to said second electrical power source, a third transistor switching means having an output connected between the biasing means of said second transistor switching circuit and said second power source and an input connected to said alternating current wave input circuit, said third transistor switching means being in one conductive state to maintain said second transistor switching means non-conductive when there is an input wave signal of either polarity, and said third transistor switching circuit means being in an opposite conductive state when said input wave is zero causing the biasing means of said second transistor switching means to bias said second transistor switching means conductive and complete the shunting circuit across the primary winding.

5. In amplifying means for alternating current waves in which there are finite periods of zero voltage, an input circuit means to which the waves to be amplified are applied, output transformer means having a primary winding, a first direct coupled compound connected transistor amplifier circuit having an input connected to the alternating current wave input means and an output connected to one terminal of the primary winding of the output transformer to form a first conductive path, a second direct coupled compound connected transistor amplifier circuit having an input connected to the alternating current wave input circuit and an output connected to another terminal of the primary winding to form a second conductive path, a diode-resistance biasing circuit means connected in circuit with said input circuit and each direct coupled compound connected transistor amplifier circuit to properly bias the transistor electrodes of said compound connected transistor circuits alternately conducting or non-conducting when said incoming wave is alternately of one polarity or the other, a source of electrical power, first transistor switching means connected to said source of electrical power and to each of said diode-resistance biasing circuit means to apply a voltage to each of said compound connected transistor amplifier circuits to bias said compound connected amplifier circuits off when the input wave is at zero voltage, short circuiting means being connected across said output primary winding, a second transistor switching means connected in circuit with said shunting circuit to connect and disconnect said shunting circuit across said output primary winding, a second source of electrical power, said second transistor switching means including biasing means connected to said second electrical power source, an electrical power storage means being connected to the output primary winding and to the biasing means of said second switching means, said storage means being charged from said output primary winding during periods when an amplified alternating current wave is being applied and current flows through the output primary winding, a third transistor switching means having an output connected between said biasing means of said second transistor switching means and said second power source and an input connected to said alternating current wave input circuit, said third transistor switching means being in one conductive state to maintain said second transistor switching means nonconductive when there is an input wave signal of either polarity, said third transistor switching circuit being in an opposite conductive state when said input alternating current wave is zero to cause said storage means to be discharged to said second transistor switching means thereby providing a resulting bias of said second transistor switching means to cause said second transistor switching means to become conductive and short circuit the output primary winding.

References Cited by the Examiner

UNITED STATES PATENTS 2,990,516 6/1961 Johannessen ------- 330—15 X

ROY LAKE, *Primary Examiner.*

JOHN KOMINSKI, *Examiner.*